United States Patent [19]
Shinriki et al.

[11] Patent Number: 5,521,423
[45] Date of Patent: May 28, 1996

[54] DIELECTRIC STRUCTURE FOR ANTI-FUSE PROGRAMMING ELEMENT

[75] Inventors: Hiroshi Shinriki, Matsudo; Takeshi Kaizuka, Chiba; Tomohiro Ohta, Urayasu, all of Japan

[73] Assignee: Kawasaki Steel Corporation, Hyogo-ken, Japan

[21] Appl. No.: 228,257

[22] Filed: Apr. 15, 1994

[30] Foreign Application Priority Data

| Apr. 19, 1993 | [JP] | Japan | 5-090318 |
| Apr. 19, 1993 | [JP] | Japan | 5-090319 |
| Apr. 20, 1993 | [JP] | Japan | 5-092960 |

[51] Int. Cl.$^6$ .......................... H01L 29/04; H01L 27/10; H01L 29/00
[52] U.S. Cl. .............. 257/530; 257/50; 257/209; 257/529
[58] Field of Search ............... 257/50, 209, 529, 257/530

[56] References Cited

U.S. PATENT DOCUMENTS

| 4,488,262 | 12/1984 | Basire et al. | |
| 5,070,384 | 12/1991 | McCollum et al. | |
| 5,166,556 | 11/1992 | Hsu et al. | 257/530 |

OTHER PUBLICATIONS

David K. Y. Liu, et al. "Scaled Dielectric Antifuse Structure for Field–Programmable Gate Array Applications," IEEE Electron Device Letters, vol. 12, No. 4, Apr. 1991.

Simon S. Cohen, et al. "A Novel Double–Metal Structure for Voltage–Programmable Links," IEEE Electron Device Letters, vol. 13, No. 9, Sep. 1992.

Primary Examiner—Sara W. Crane
Assistant Examiner—Valencia Martin Wallace
Attorney, Agent, or Firm—Oliff & Berridge

[57] ABSTRACT

An antifuse element suitable for use in FPGA. When a device is miniaturized to reduce the write voltage in an antifuse element and as the film thickness of the antifuse dielectric film is being reduced, the dielectric breakdown voltage is greatly variable due to the irregularity of the underlying metal. If the dielectric film is formed by a metal oxide having a relatively high specific permittivity without changing its parasitic capacity as compared to the prior art, the film thickness of the dielectric film can be increased in comparison with oxide and nitride films formed according to the prior art. The irregularity of the underlying metal can be reduced by coating it with a metal nitride or TiB film or TiC film. To equalize the dielectric breakdown voltage, another insulation film having a film thickness such that the direct tunnel conduction is dominant is formed below the metal oxide. To reduce the irregularity of the metal surface and to reduce the resistance after dielectric breakdown, an amorphous silicon layer is deposited before the metal oxide is deposited thereover to form a laminated film.

15 Claims, 11 Drawing Sheets

Fig. 15 PRIOR ART

DIELECTRIC STRUCTURE FOR ANTI-FUSE PROGRAMMING ELEMENT

BACKGROUND OF THE INVENTION

1. Field of the Invention

The present invention relates to an integrated circuit technology and more particularly to an improved antifuse element suitable for use as a programmable element in a field-programmable gate array which is a gate array capable of being programmed in fields by a user.

2. Prior Art

Figure 15:
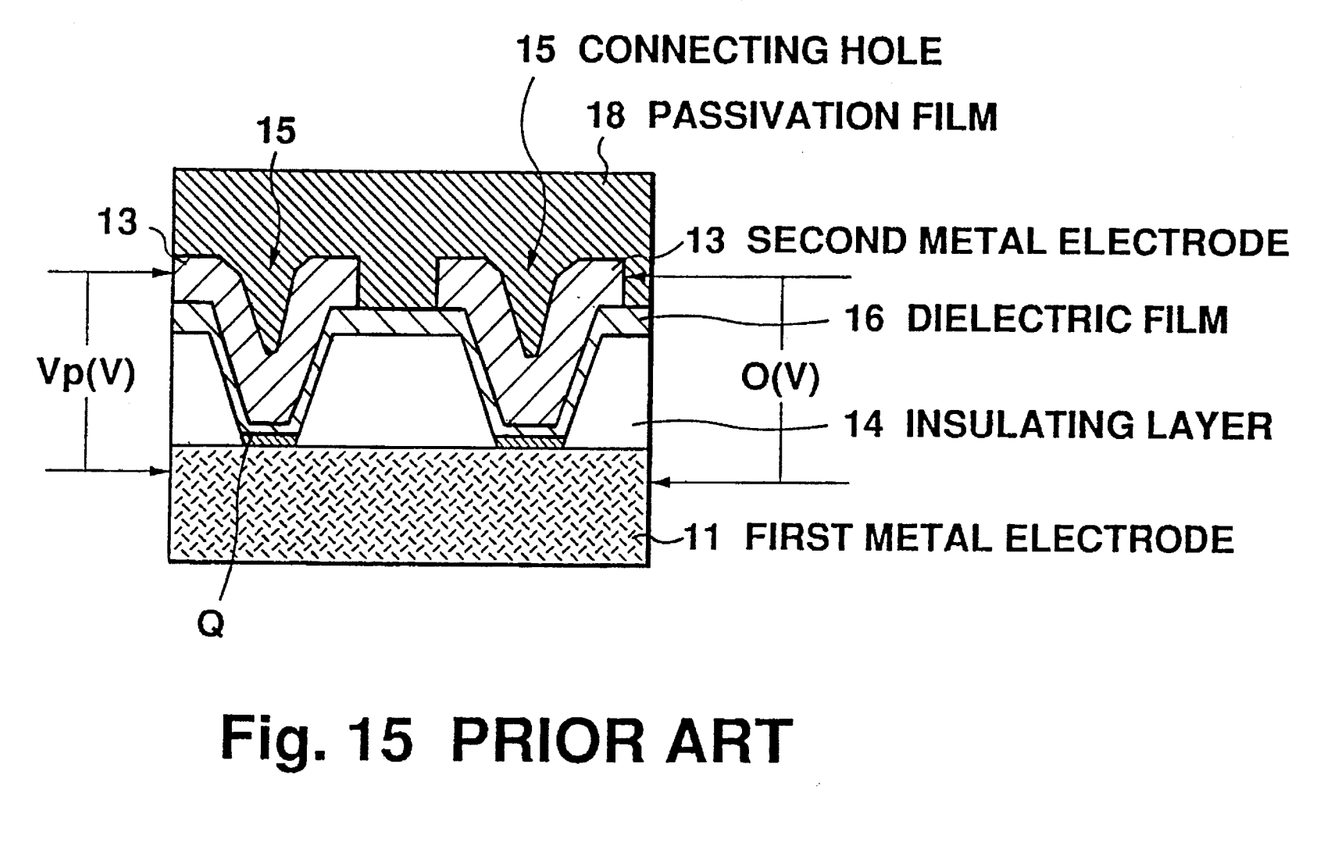
FIG. 15 is a diagrammatic cross-sectional view of an antifuse element according to the prior art.

The antifuse element is one of program elements used in a programmable memory and a programmable logic. Attention is being paid to such antifuse elements due to the fact that they have increasingly became to be used in the field of FPGA (Field-Programmable Gate Array). FPGA is one of PLDs (Programmable Logic Devices) in which a chip includes wirings formed therein to connect between functional blocks, each being a lump of basic logic circuits. A program element is adapted to select the connection between a functional block to be used and a wiring. Such a program element can be in the form of SRAM, EEPROM, fuse or antifuse. Among them, the antifuse system is more advantageous in that it is suitable for large capacities since the program element thereof can be reduced to a size smaller than the other program elements. Another advantage of the antifuse system is that it is suitably used to increase the speed of a device since the connection resistance thereof can be reduced. FIG. 15 shows an antifuse element constructed in accordance with the prior art. The antifuse element comprises a first metal electrode 11, a second metal electrode 13 spaced apart from the first metal electrode 11, a connecting hole 15 formed in insulating layer 14 to extend from the second metal electrode 13 therethrough to the first metal electrode 11, and a dielectric film 16 formed in the connecting hole 15 to insulate between the first and second metal electrodes 11, 13.

When a voltage is applied between the first and second metal electrodes 11, 13, the dielectric film 16 in the connecting hole 15 may be broken down by such a voltage (at an area shown by Q in FIG. 15). The voltage creating such a dielectric breakdown is known as write voltage or program voltage (which will be referred to as "write voltage $V_p$" herein). When such a write voltage is applied to the antifuse element, the connection is made between the metal electrodes.

An FPGA includes a plurality of such antifuse elements. By selectively dielectric breaking some connecting holes in the antifuse elements, a desired program can be provided. More particularly, in such FPGA wirings, the writing voltage is selectively applied to the respective connecting holes to create the dielectric breakdown in the dielectric film, resulting in continuity of the desired wiring.

Dielectric materials which have been used to form antifuse elements include single-layer films of $S_iO_2$, $Si_3O_4$, $Al_2O_3$ and the like, a laminated film consisting of silicon oxide film and silicon nitride film, amorphous $S_i$, transition metal's oxide and so on.

The dielectric film of the antifuse element must be broken down by a given voltage, but should not be broken down by a voltage equal to or lower than a predetermined level, for example, by the operational voltage of a device. However, the dielectric films of $S_iO_2$, $Si_3O_4$ or the like used by the prior art tend to be broken down due to a local concentration of electric field that is produced by a protrusion formed on the surface of the metal electrode when the dielectric film is formed as a thin film. Such a problem becomes more marked when the dielectric film is formed as a thin film depending on the current tendency of increasingly reducing the operational voltage of the device. When the operational voltage of the device is reduced, the write voltage $V_p$ of the antifuse element must also be correspondingly reduced. To reduce the write voltage $V_p$, the thickness of the dielectric film is also required to be reduced. This causes the irregularity of the metal electrode surface to have a greater influence on the dielectric film. Thus, the antifuse element may be accidentally broken down by the operational voltage of a device which does not intend the dielectric breakdown with reduction of the operational voltage. This will adversely affect the reliability of the antifuse element.

As the antifuse element is miniaturized to increase the aspect ratio of the connection hole, it becomes difficult to form a uniform dielectric film. Particularly if dielectric films are formed by CVD having a good step coverage, it is difficult to deposit dielectric films having a good film property at a reduced temperature. This creates protrusions on the surface of the metal electrode when the dielectric film is deposited. The protrusions will degrade the insulating characteristics in the antifuse element. A method which can form a good film at a reduced temperature is reactive sputter. However, these methods do not provide a good step coverage in the film.

In view of the aforementioned problems in the prior art, it is an object of the present invention to provide an antifuse element having an improved reliability which is suitable for use as FPGA program element responsive to an reduced operational voltage.

More particularly, an object of the present invention is to provide an antifuse film which can be broken down by a reduced write voltage $V_p$.

Another object of the present invention is to reduce the variance of the dielectric breakdown due to the local concentration of electric field so as to increase the reliability.

Still another object of the present invention is to lower the connection resistance of a program element so as to increase the speed of a device.

SUMMARY OF THE INVENTION

To this end, the present invention provides an antifuse element which comprises a dielectric film formed of a metal oxide having a relatively high permittivity and a lower metal wiring having its surface coated with a film of metal nitride.

More particularly, the present invention provides a semiconductor device having an antifuse structure comprising a first metal wiring, a second metal wiring, an insulating layer formed between the first and second metal wirings, a connection hole formed in said insulating layer therethrough and a dielectric film formed in the connection hole for insulating between said first and second metal wirings, wherein said metal oxide is one selected from a group consisting of Ti, Ta, Nb, Zr, Hf and Al oxides and wherein said first metal wiring is coated with one selected from a group consisting of Ti, Ta, Nb, Zr and Hf nitrides or TiB film or TiC film.

In another aspect of the present invention, the semiconductor device includes an antifuse element having a film formed of a metal oxide having a relatively high permittivity and an intermediate thin film deposited under the dielectric film and having a sufficiently low permittivity to permit the flow of a tunneling current, said dielectric and intermediate films being adapted to insulate the upper and lower metal wirings.

Such an intermediate thin film can be formed of a silicon dioxide having a film thickness of 4 nm or less. In such a case, the first metal wiring is preferably formed of at least one selected from a group consisting of Ti, Ta, Nb, Zr, Hf, Co, Y, W and Mo silicides and silicon.

The intermediate film of silicon dioxide having a film thickness of 4 nm or less can be formed at the boundary between the first metal wiring and dielectric film by processing them in the oxidizing atmosphere after the dielectric film of metal oxide has been formed on the first metal wiring.

If the relationship of film thickness is set to meet the thickness of the dielectric film<(the specific permittivity of the dielectric film/the specific permittivity of the intermediate film)×the thickness of the intermediate film, the intermediate and dielectric films can simultaneously be subjected to dielectric breakdown.

The present invention is further characterized by that a silicon film is chemically vapor deposited on the irregular surface of the metal wiring to smooth the irregularity thereof and that a dielectric layer is thereafter deposited on the silicon film to form a dielectric film. In other words, the dielectric film of the antifuse element consists of a vapor deposited silicon film, a silicon oxide film formed on the silicon film and a laminated film formed of a material of high permittivity.

More particularly, the dielectric film of the antifuse comprises a vapor deposited silicon film, a silicon oxide film laminated on the silicon film and a laminated film formed of one selected from a group consisting of Ti, Ta, Nb, Zr, Y, Hf and Al oxides. Furthermore, the semiconductor device is characterized in that the first metal wiring is coated with a coating selected from a group consisting of Ti, Ta, Nb, Zr, Y and Hf nitrides or TiB film and TiC.

The present invention is further characterized by that after a conducting passage has been embedded in the insulating layer, the surface thereof is flattened and then coated with an antifuse dielectric film to reduce the aspect ratio at the connection of the antifuse element. The dielectric film can be formed with an improved reliability for dielectric breakdown through reactive sputter or the like. The semiconductor device is still further characterized in that the dielectric film contains constituent elements of the conducting passage. The semiconductor device is further characterized by that said conducting passage is formed of W, Al or Cu or one selected from a group consisting of Ti, Ta, Nb, Zr, Y and Hf nitrides or one selected from a group consisting of Ti, Ta, Nb, Zr, Y and Hf silicides.

A method of producing the above semiconductor device is characterized by the steps of embedding said conducting passage in said insulating layer, smoothing the surface of the insulating layer in which the conducting passage has been embedded, and coating the smoothed surface with said dielectric film.

BRIEF DESCRIPTION OF THE DRAWINGS

FIGS. 2(a) and (b) are diagrammatic views illustrating the advantages of the first embodiment of the present invention.

FIGS. 3(a) and (b) are diagrammatic cross-sectional views of a second embodiment of the present invention.

FIGS. 7(a) and (b) are graphs illustrating the dependency of dielectric breakdown frequency on the applied voltage in the antifuse elements according to the second embodiment of the present invention and the prior art.

FIGS. 8(a) and (b) are graphs illustrating the variance of resistance after the dielectric breakdown in the second embodiment of the present invention and the prior art.

FIGS. 9(a), (b) and (c) are diagrammatic cross-sectional views illustrating the production process in a third embodiment of the present invention.

FIGS. 10(a) and (b) show models illustrating the advantages of the third embodiment of the present invention.

FIGS. 11(a) and (b) are graphs illustrating the dependency of dielectric breakdown frequency on the applied voltage in the antifuse elements according to the third embodiment of the present invention and the prior art.

FIGS. 12(a) and (b) are graphs illustrating the variance of resistance after the dielectric breakdown in the antifuse elements according to the third embodiment of the present invention and the prior art.

FIGS. 14(a) and (b) are graphs illustrating the dependency of dielectric breakdown frequency on the voltage in the antifuse elements according to the fourth embodiment of the present invention and the prior art.

DETAILED DESCRIPTION OF THE PREFERRED EMBODIMENTS

Figure 1:
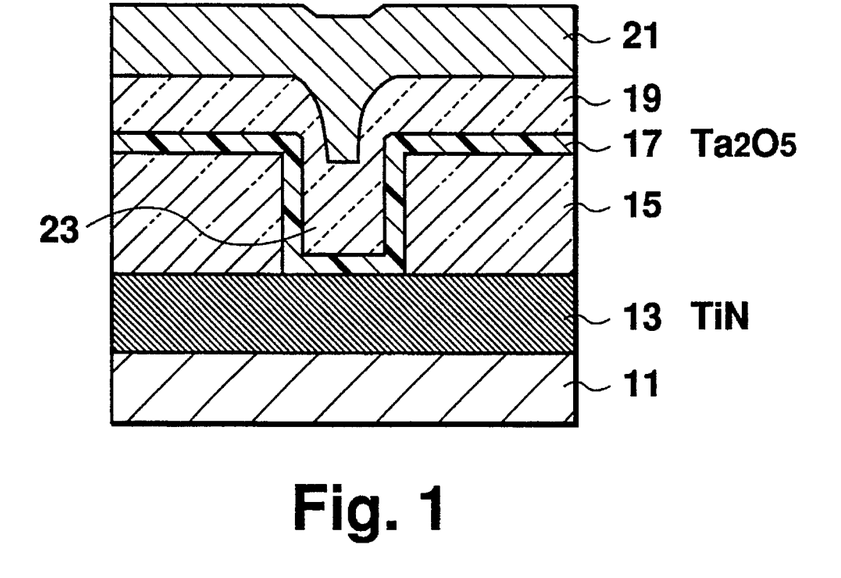
FIG. 1 is a diagrammatic cross-sectional view of a first embodiment of the present invention.

FIG. 1 is a cross-sectional view of an antifuse element constructed according to a preferred embodiment of the present invention. The antifuse element is formed after n-ch Tr or P-ch Tr has been formed on a semiconductor substrate through the conventional CMOS process and a first metal wiring has been formed on an interlayer insulating film. FIG. 1 does not show a transistor forming part which would be located below the antifuse element. The antifuse element of this embodiment comprises a first metal wiring of Al alloy 11 having a film thickness of about 5000A, a titanium nitride layer 13 formed over the first metal wiring 11 and having a film thickness of about 1000A, and an interlayer insulating layer 15 formed over the titanium nitride layer 13 and having a film thickness of about 1 μm after the titanium nitride layer 13 has been patterned through the conventional photolithograph and etching techniques. A second metal wiring 19 is further formed over the interlayer insulating layer 15 through an antifuse dielectric film 17. A passivation film 21 is still further formed over the second metal wiring 19. The insulating layer 15 includes a connection hole 23 formed therethrough. The connection hole 23 receives portions of the dielectric film 17, second metal wiring 19 and passivation film 21. Thus, the insulating layers 15 and 17 exist between the titanium nitride layer 13 and the second metal wiring 19 at parts other than the connection hole 23 while only the dielectric layer 17 is present in the connection hole 23.

The antifuse dielectric film 17 is a tantalum oxide film having a film thickness of 30 nm which is formed by thermal decomposing a vapor of ethoxy tantalum alcoholate (Ta(OC$_2$H$_5$)$_5$) at a substrate temperature of 400° C. under a reduced pressure of one Torr in an oxygen atmosphere. The dielectric film 17 is formed over the insulating layer 15 having a plurality of connection holes 23. Thereafter, the second metal wiring 19 is patterned on the dielectric layer 17. After the passivation film 21 has been formed over the pattern of the second metal wiring 19, external wirings are extended from the passivation film 21 to form FPGA wirings.

Figure 2:
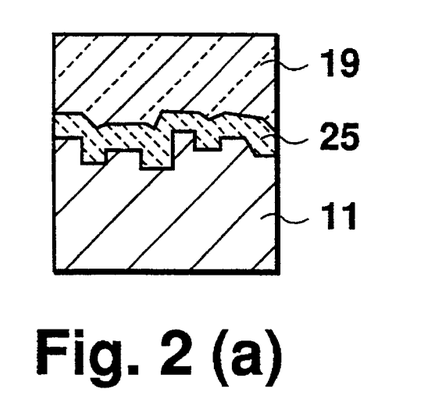

FIG. 2(a) diagrammatically shows an interfacial state when the second metal wiring is formed after a silicon dioxide layer having a specific permittivity of 3.8 and a film thickness of 6 nm has been formed over the first metal wiring 11. FIG. 2(b) shows the formation of a tantalum oxide film having a permittivity about six times larger than that of the silicon dioxide. To equalize the parasitic capacity, the thickness of the tantalum oxide film may be larger than that of the silicon dioxide film. Therefore, the tantalum oxide film can relieve the local concentration of electric field due to the irregularity of the first metal wiring surface to suppress the variance of dielectric breakdown voltage.

Although the first embodiment forms the tantalum oxide film through deposition, it may be similarly formed by forming a TaN film over the top of the first metal wiring 11 before the TaN film is oxidized.

The present invention can provide an insulation film having an increased thickness in the same capacity by forming it from a metal oxide having a higher permittivity, namely one selected from a group consisting of Ti, Ta, Nb, Zr, Y, Hf and Al. Therefore, any localized concentration of electric field due to the irregularity of the first metal wiring surface can be relieved to suppress the variance of the dielectric breakdown.

Figure 3:
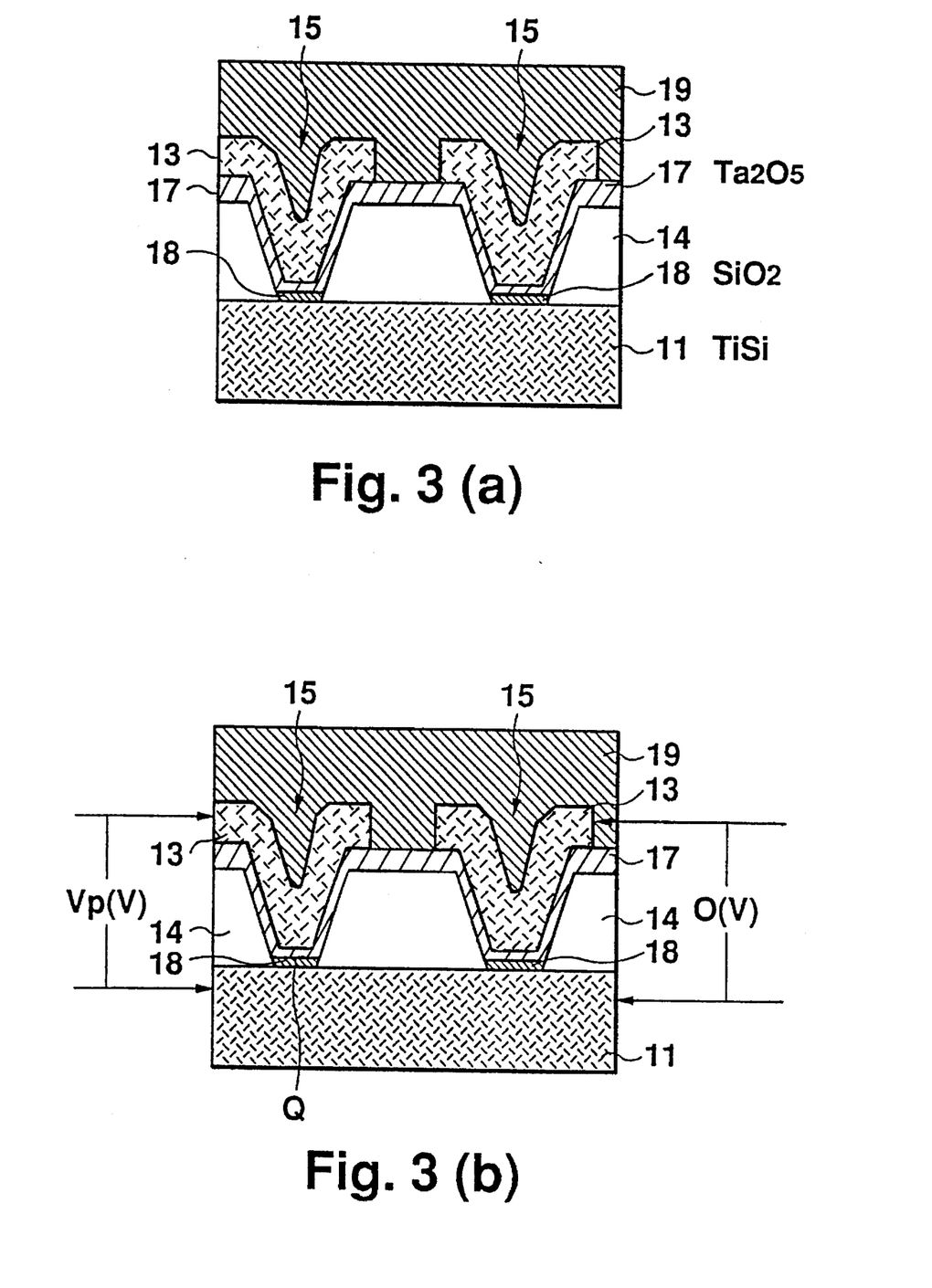

FIGS. 3(a) and 3(b) are a diagrammatic cross-sectional views of an antifuse element in a semiconductor device (FPGA) according to a preferred second embodiment of the present invention. The second embodiment will be produced as follows:

First of all, an interlayer insulating layer 14 is formed over a titanium silicide layer which is the first metal wiring 11. The interlayer insulating layer 14 is formed with openings at given locations through patterning and etching. A tantalum oxide film having a thickness of 20 nm and used as the dielectric film 17 is formed by thermal decomposing a vapor of ethoxy tantalum alcoholate (Ta(OC$_2$H$_5$)$_5$) at a substrate temperature of 400° C. under a reduced pressure of one Torr. Thereafter, it is thermally treated at 780° C. for 30 minutes in an oxidizing atmosphere to form a silicon dioxide film having a film thickness of 2.5 nm at the interface between the tantalum oxide film 17 and the titanium silicide layer 11. Otherwise, the tantalum oxide film is treated at 400° C. for 30 minutes in an oxygen plasma generated by 13.56 MHz radio frequency (RF) or treated at 300° C. for 30 minutes in O$_3$ atmosphere under UV irradiation. In this embodiment, the silicon dioxide film becomes a physical intermediate film 18. Thereafter, the second metal wiring 13 is formed over the dielectric film 17. The second metal wiring is then patterned to form the passivation film 19 for protecting it. External wirings are finally extended outwardly to complete the FPGA.

FIGS. 3(a) and (b) also show two antifuse elements as typical FPGAs for illustrating the structure and specification of an FPGA. FIG. 3(a) shows both the right and left antifuse elements which are not subjected to dielectric breakdown while FIG. 3(b) shows the left antifuse element which is subjected to dielectric breakdown so that the first conductive metal wiring 11 is connected to the second left conductive metal wiring 13. In FIG. 3(b), pulses of a given voltage as a write voltage are applied to between the first conductive metal wiring 11 and the second left conductive metal wiring 13 to create a dielectric breakdown therein. On the other hand, no write voltage is applied to the right antifuse element. Thus, the first conductive metal wiring 11 is insulated from the second right conductive metal wiring 13. Consequently, the operational current of the antifuse element flows through the left wiring, but not through the right wiring. Actually, any wiring connection can be provided by selectively subjecting a plurality of antifuse elements formed on the element to dielectric breakdown for short-circuiting.

Figure 4:
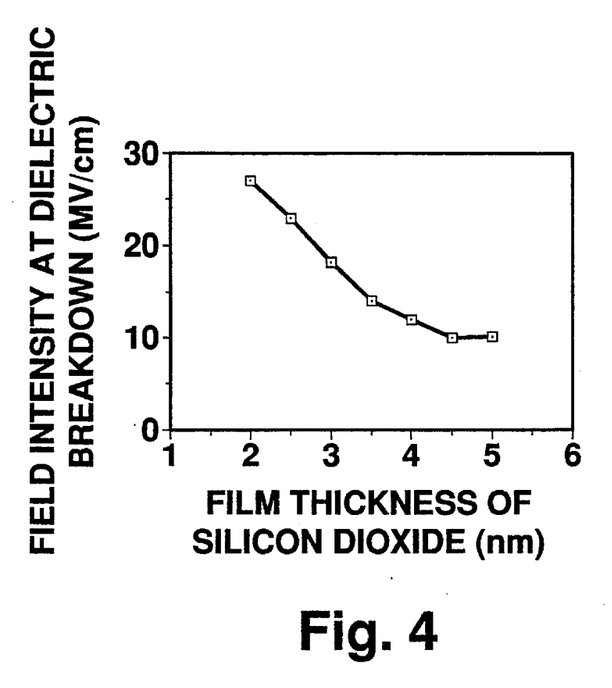
FIG. 4 is a graph illustrating the relationship between the film thickness of a silicon dioxide film and the maximum dielectric breakdown strength.

Since the antifuse element can have an increased film thickness without change of its capacity by forming the dielectric film 17 from a metal compound of high permittivity, any localized concentration of electric field due to the irregularity in the surface of the first metal wiring 11 can be relieved to suppress the variance of dielectric breakdown voltage. By forming a thin film sufficiently to permit the flow of tunnel current, the dielectric breakdown characteristics can be substantially equalized. This will be described in connection with the thin film of silicon dioxide (intermediate film 18) in this embodiment. As shown in FIG. 4, the field intensity required by dielectric breakdown will be increased more as the thickness of the silicon dioxide film 18 through which the tunnel current flows is more reduced. Thus, the voltage required by dielectric breakdown remains relatively constant even if the film thickness is variable.

Figure 5:
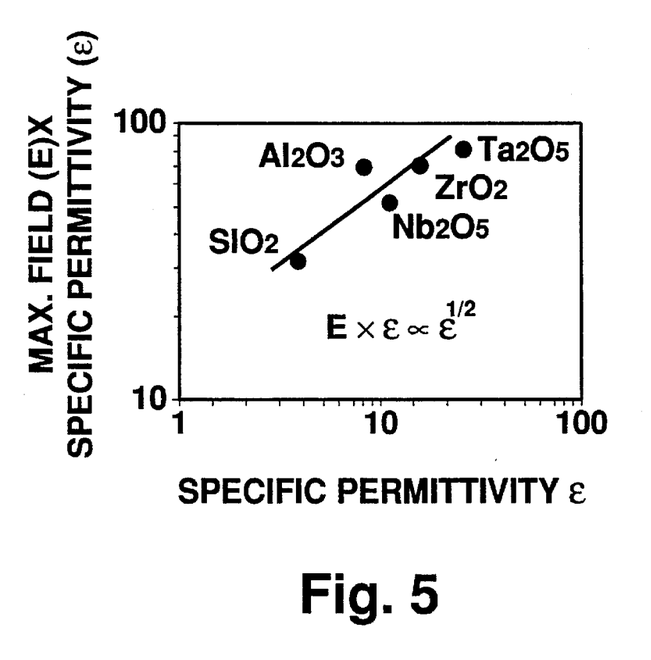
FIG. 5 is a graph illustrating the relationship between the specific permittivity and the dielectric breakdown strength.

FIG. 5 shows the relationship between the specific permittivity of various dielectric films and the field intensity required by dielectric breakdown. The relationship between the specific permittivity and the field intensity is represented by:

$$\epsilon \times E = K \epsilon^{1/2}.$$

In comparison with the silicon dioxide film having the same capacity, it is thus understood that the voltage required to subject a dielectric of higher specific permittivity to dielectric breakdown tends to increase, but does not often exceed two times. When it is assumed that the specific permittivity of the silicon dioxide film is $\epsilon$ s, the film thickness thereof is Ts, the specific permittivity of the metal oxide film is $\epsilon$ M and the film thickness thereof is TM and if the film thickness TM of the metal oxide film satisfies the following relationship $$TM < Ts \times \epsilon M/\epsilon S,$$

it is believed that the metal oxide film (dielectric film 17) is subjected to dielectric breakdown at the same time when the silicon dioxide film (intermediate film 18) is subjected to dielectric breakdown.

Figure 6:
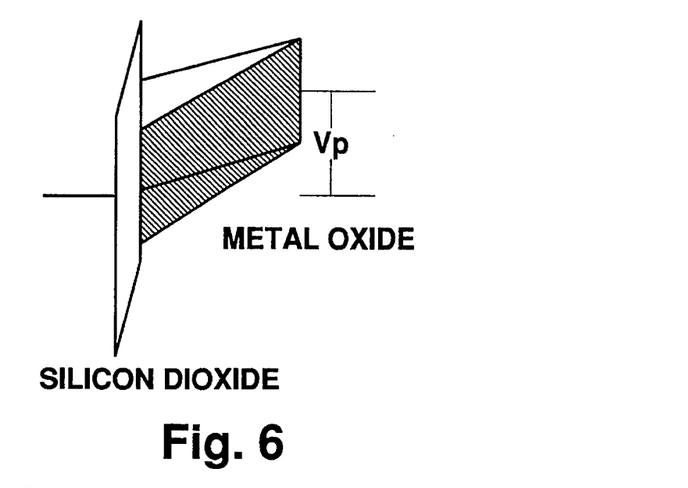
FIG. 6 is a model of band diagram illustrating the advantages of the second embodiment of the present invention.

FIG. 6 illustrates these situations using a band diagram. When the silicon dioxide film is subjected to dielectric breakdown, all the voltage applied to the silicon dioxide film will be applied to the metal oxide film to incline the band as shown by hatching in FIG. 6. This provides a continuous dielectric breakdown. In this embodiment, therefore, the uniform dielectric breakdown characteristics in the insulation film at the tunneling area can be utilized to reduce the write voltage while equalizing the breaking voltage as well as resistance.

Figure 7:
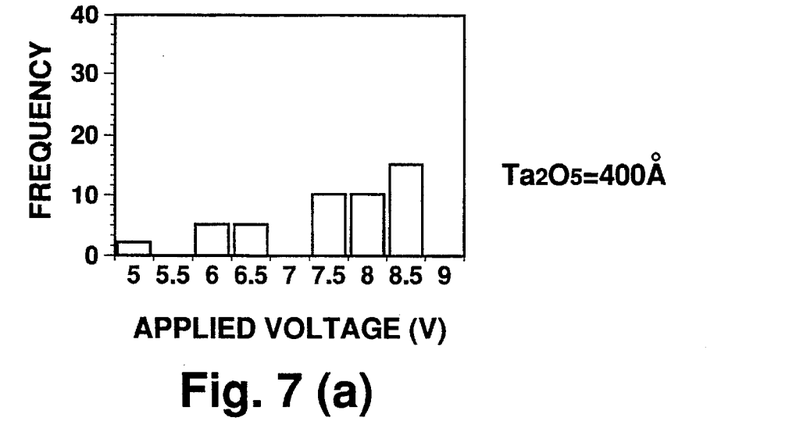

FIG. 7(a) is a histogram of dielectric breakdown voltage when only a tantalum oxide film of 40 nm is used as antifuse dielectric while FIG. 7(b) is a histogram of dielectric breakdown voltage in the aforementioned embodiment. As shown in FIG. 7(b), the dielectric breakdown characteristics are substantially equalized if the antifuse dielectric film is constituted as a stacked or laminated film formed of the tantalum oxide film and a silicon dioxide film having its film thickness sufficient to permit the direct flow of tunnel current. On the contrary, the dielectric breakdown voltage is greatly variable in the case of only the tantalum oxide film, as shown in FIG. 7(a).

Figure 8:
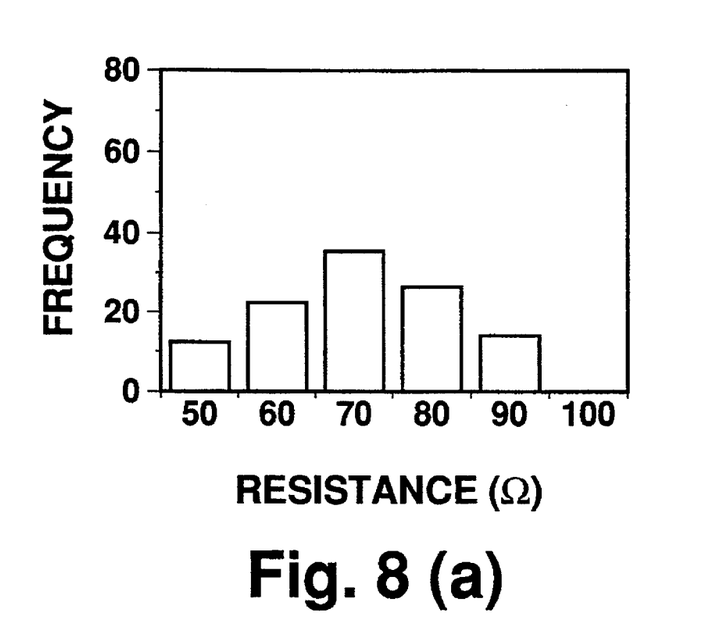

FIG. 8(a) is a histogram of resistance when only a tantalum oxide film of 40 nm is used as antifuse dielectric while FIG. 8(b) is a histogram of resistance in the aforementioned embodiment. As will be apparent from these histograms, the prior art causes the distributed resistance at the connection hole to be variable after dielectric breakdown while the antifuse element of this embodiment can have an extremely uniform resistance.

Although this embodiment has been described as to the tantalum oxide film used as a dielectric film, it is not limited to the tantalum oxide film, but may provide the same advantages if it is formed by any other oxide selected from a group consisting of Ti, Nb, Zr, Y and Hf.

Although this embodiment has also been described as to the silicon dioxide film used as an intermediate film indicating the tunnel conduction, the intermediate film is not limited to the silicon dioxide film, but may provide the same advantages, for example, from films of silicon nitride or silicon oxy-nitride or others.

In the antifuse element according to this embodiment, an extremely uniform dielectric breakdown quality can be realized by using a laminated film which comprises a dielectric film formed of a metal compound of high permittivity and a thin silicon dioxide film.

A third embodiment of the present invention will now be described.

Figure 9:
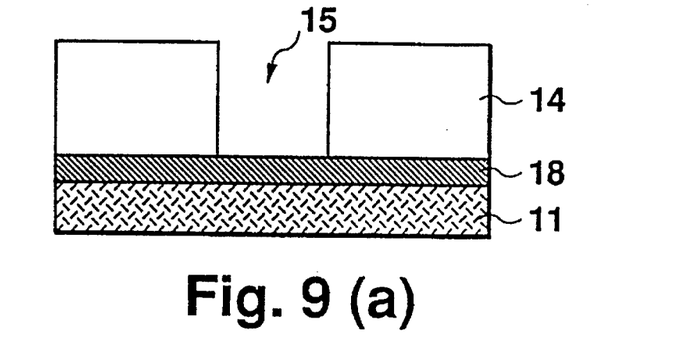

A method of forming an antifuse element according to the third embodiment will be described with reference to FIGS. 9(a), (b) and (c). First of all, a titanium nitride layer having its film thickness of 0.1 μm is formed, as a first intermediate film 18, over a first metal wiring 11 which is constituted of an aluminum layer having its film thickness of 0.8 μm. An interlayer insulation film 14 of silicon dioxide is then formed over the first intermediate film 18 with its film thickness of 1.0 μm. Through the patterning and etching, openings are formed in the interlayer insulating film 14 at given locations to form connection holes 15 as shown in FIG. 9(a).

After the connection holes 15 have been formed, monosilane gas is thermally decomposed by a radio frequency of 13.56 MHz under a reduced pressure to deposit an amorphous silicon film 17a of 5 nm film thickness over the entire interlayer insulation film 14 and in the connection holes 15. A tantalum oxide film 17c of 30 nm film thickness is formed over the amorphous silicon film 17a by thermally decomposing a vapor of ethoxy tantalum alcoholate (Ta(OC$_2$H$_5$)$_5$) at a substrate temperature of 400° C. under a reduced pressure of one Torr within an oxygen atmosphere. As a result, a silicon oxide film 17b of 2 nm film thickness is formed at the interface between the amorphous silicon film 17a and the tantalum oxide film 17c, as shown in FIG. 9(c). After the tantalum oxide film is formed, the film may be treated at 400° C. for 30 minutes in an oxygen plasma generated by 13.56 MHz radio frequency or treated at 300° C. for 30 minutes in O$_3$ atmosphere under UV irradiation. Thereafter, titanium nitride (0.1 μm) and aluminum (0.8 μm) are sequentially deposited to form a second intermediate film 19 and a second metal wiring 13. The second metal wiring 13 is then patterned before a passivation film (not shown) is formed thereon as a protective film. Finally, external wirings are taken out to form FPGA wirings, as shown in FIG. 9(c).

Figure 10:
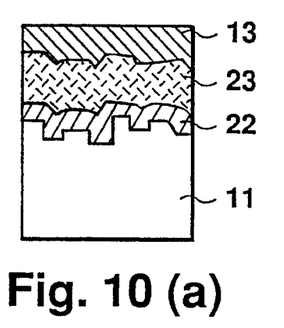

FIGS. 10(a) and (b) diagrammatically show the connection between the first metal wiring 11 and the insulation film 17 for illustrating the advantages of the antifuse element according to the third embodiment.

FIG. 10(a) diagrammatically shows the structure of the prior art for comparison while FIG. 10(b) diagrammatically shows the structure of the third embodiment.

In the prior art, first, a metal oxide layer 22 is formed directly over the irregular surface of the first metal wiring 11 through oxidization. The second metal wiring 13 is then formed over the metal oxide layer 22. In such a case, the metal oxide and silicon layers 22, 23 function as an dielectric film 17. However, the metal oxide layer frequently tends to be subjected to dielectric breakdown due to the influence of irregular crystal grains on the metal surface. It is therefore extremely difficult to form a thin insulation film having a sufficient dielectric strength. Such an antifuse dielectric film is required to be subjected to dielectric breakdown with a given voltage. This raises a problem of reliability since the dielectric breakdown is created by a voltage lower than the given voltage.

On the contrary, the method of the third embodiment first forms a thin amorphous silicon layer 25 over the surface of a metal film 21 before a laminated layer of silicon oxide 26/metal oxide 27 and an upper metal wiring 28 are formed over the silicon layer 25. Thus, the original irregularity of the metal surface due to crystal grains will be relieved so that the antifuse element will hardly be subjected to dielectric breakdown. More particularly, the surface can be made extremely smooth since the amorphous silicon layer has no crystalline interface. The silicon dioxide film 26 may be a natural oxide film on the silicon layer 25 or intentionally formed thereon. Further, the antifuse element also includes a silicon oxide layer which is grown by thermally treating the metal oxide 27 within an oxidizing atmosphere after it has been formed.

Figure 11:
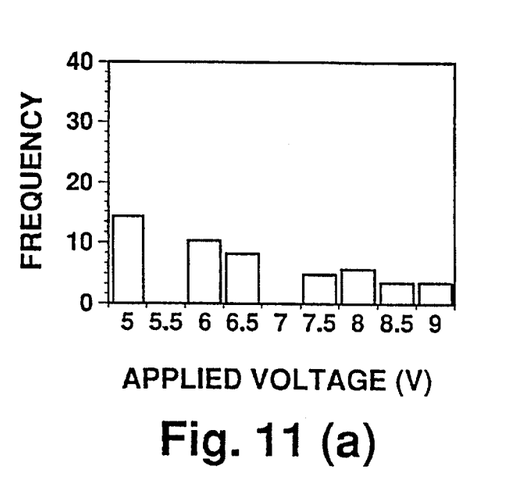

FIGS. 11(a), 11(b), 12(a) and 12(b) are graphs showing the advantages of the semiconductor device according to the third embodiment in comparison with the prior art. In the prior art to be compared, the dielectric film 17 is formed of a titanium oxide film obtained by oxidizing a titanium film which has been formed over the first metal wiring 11. The titanium oxide film has its film thickness of 40 nm. On the other hand, the third embodiment provides a silicon oxide film 17b of 5 nm film thickness for substantially equalizing the capacity. FIG. 11 is a histogram showing the dependency of dielectric breakdown on the applied voltage. As shown in FIG. 11(a), the titanium oxide film of 40 nm film thickness formed by oxidizing the titanium film provides a greatly variable dielectric breakdown voltage due to the influence of the irregular surface. On the contrary, as shown in FIG. 11(b), the dielectric breakdown characteristics becomes extremely uniform when a laminated structure is formed of tantalum oxide/silicon dioxide/amorphous silicon as in the third embodiment of the present invention.

Figure 12:
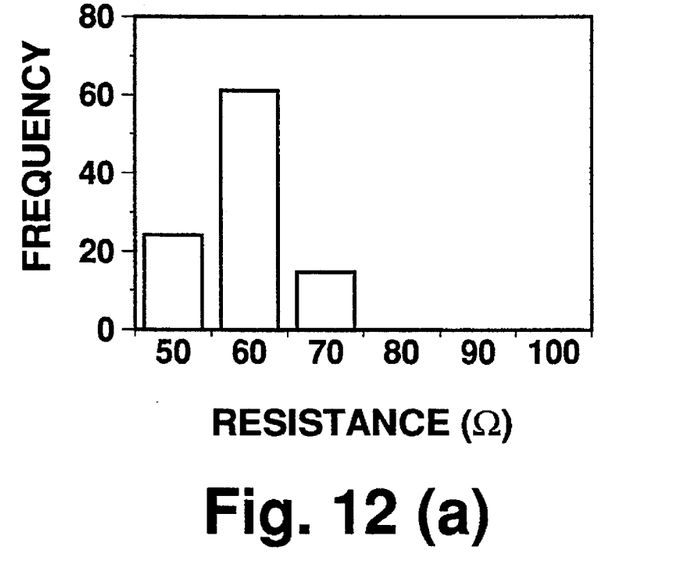

FIGS. 12(a) and (b) show the distributions of resistance at the connection holes after dielectric breakdown in the prior art and in the present invention. The distribution of resistance after dielectric breakdown in the present invention is equal to that of the prior art.

Although the third embodiment has been described as to the use of tantalum oxide film as a laminated film, the same advantages can be provided even by forming the laminated oxide film from one selected from a group consisting of Ti, Ta, Nb, Zr, Y, Hf and Al. The amorphous silicon layer may be replaced by either of metal silicide film or amorphous metal silicide film to provide the same advantages. Further, the metal oxide/silicon oxide/silicon structure may be repeatedly laminated with the same advantages. Still further, a programmable gate array having a greatly superior reliability can be realized by arranging titanium nitride materials less reactive to silicon at the outside of the above-mentioned structure.

Although the third embodiment has been described as to the use of titanium nitride as an intermediate film, it is not limited to such an intermediate film, but may be applied to one selected from a group consisting of Ta, Nb, Zr, Y and Hf nitrides or TiB or TiC.

According to the present invention, by forming an amorphous silicon layer over the metallic surface, the irregularity thereof can be relieved. By forming a metal oxide layer over such a silicon layer through chemical vapor deposition, further, a metal oxide can be formed more uniformly. In other words, the amorphous silicon layer can provide a very smooth surface without any crystalline interface. By thermally treating the metal oxide within the oxidizing atmosphere, the insulation quality of the metal oxide can be greatly improved to increase the reliability. At this time, a silicon oxide layer is grown in the interface between the silicon layer and the metal oxide. This oxidization greatly reduces any defective density. If a write voltage is applied to the connection hole in such a structure, the silicon and metal oxide layers are subjected to dielectric breakdown before a metal silicide is formed from the silicon supplied from the thin silicon layer to form low-resistance conducting passages. Thus, the present invention can reduce the electric resistance after dielectric breakdown. When the silicon and metal oxide layers are reduced in film thickness to form a laminated structure, the dielectric breakdown can more reliably be created to form a low-resistance conducting passage more rapidly.

A fourth embodiment of the present invention will now be described.

Figure 13:
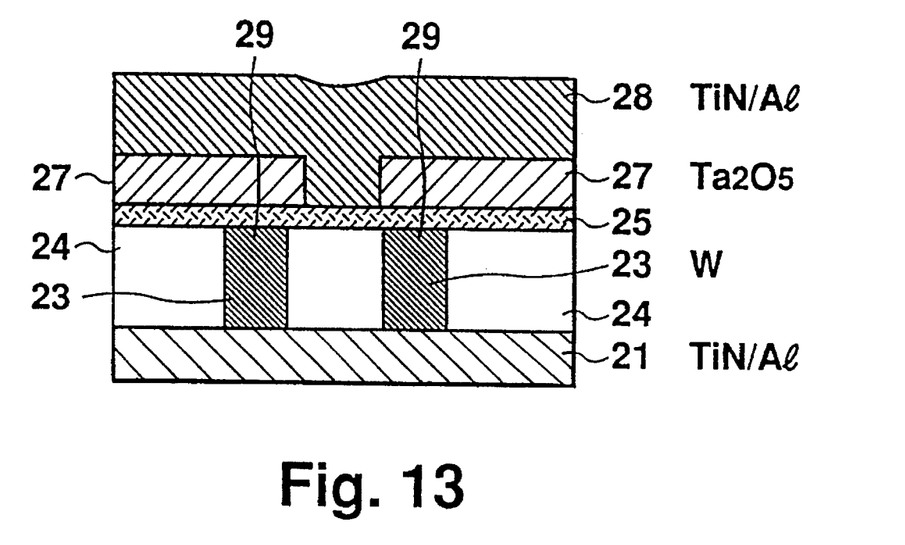
FIG. 13 is a diagrammatic cross-sectional view of a fourth embodiment of the present invention.

FIG. 13 is a diagrammatic cross-section of an antifuse element according to the fourth embodiment of the present invention. The antifuse element comprises a first metal wiring 21 formed of titanium nitride/aluminum layer, an interlayer insulating layer 24 deposited over the first metal wiring 21 and including conducting passages embedded therein, a dielectric film 25 formed over the interlayer insulating layer 24, a second metal wiring 7 formed over the dielectric layer 25 and a passivation film formed over the second metal wiring 27.

Each of the conducting passages 23 is formed by forming openings through the insulating layer 24 to form connection holes 29, then coating the connection holes with tungsten through CVD and finally embedding tungsten only into the connection holes through etch-back. The antifuse dielectric film 25 is formed of tantalum oxide through the reactive sputter process. The tantalum oxide film is formed into a film thickness of 50 nm within argon and oxygen atmospheres by using the tantalum as a target. The second metal wiring 27 is formed of laminated TiN/aluminum wiring and patterned to form a passivation film 28 which is a film of PSG/plasma silicon nitride as a protective film. External wirings are taken out therefrom to form FPGA wirings. Thus, the surface of the interlayer insulating film 24 in which the conductive passages are embedded can be smoothed. In addition, the dielectric film can be formed through the reactive sputter process which can form a dielectric film having its insulation quality superior at reduced temperatures.

Figure 14:
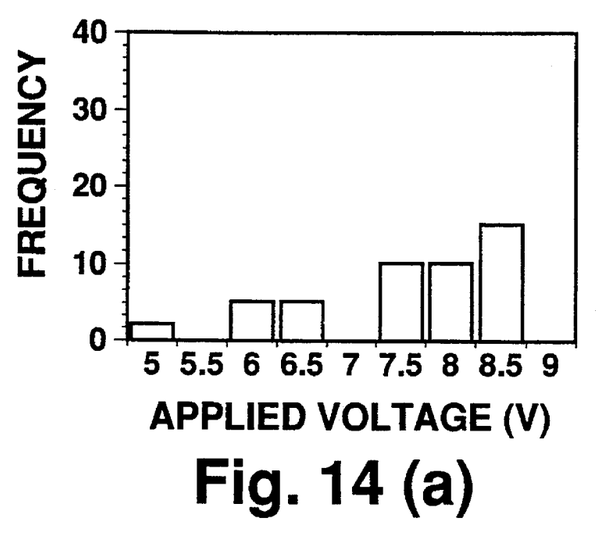

FIGS. 14(a) and (b) respectively show a histogram of dielectric breakdown voltage when dielectric films (tantalum oxide films) are formed according to the prior art and the present invention. FIG. 14(a) show the prior art in which the tantalum oxide film of 50 nm film thickness is formed on the bottom of the connection hole through the CVD process while FIG. 14(b) shows that of the fourth embodiment. As will be apparent, the fourth embodiment can provide an antifuse element which may be subjected to dielectric breakdown by a very uniform and high write voltage.

The conducting passages 23 of the fourth embodiment are formed of W. However, they can similarly be formed of Al or Cu or one selected from a group consisting of Ti, Ta, Nb, Zr and Hf nitrides or one selected from a group consisting of Ti, Ta, Nb, Zr and Hf silicides. If the constituent elements usable in forming the antifuse dielectric film 25 contain any element forming the conducting passages 23, the adhesion between the dielectric film 25 and the conducting passages 23 can be improved to increase the reliability in the semiconductor device.

Since the fourth embodiment can provide a thin dielectric film formed at a flattened area, the antifuse dielectric film can be formed through the reactive sputter process or the like which can form a film superior in dielectric breakdown quality at reduced temperatures. This can greatly increase the reliability in the antifuse of FPGA.

We claim:

1. A semiconductor device having a plurality of antifuse elements each comprising a first metal wiring, a second metal wiring, an interlayer insulating layer formed between the first and second metal wirings, a connection hole formed in said interlayer insulating layer therethrough and a dielectric film formed in the connection hole for insulating between said first and second metal wirings, wherein said dielectric film is selected from a group consisting of Ti, Ta, Nb, Zr, Y and Hf oxides and wherein an intermediate insulating film is formed between and in direct contact with said first metal wiring and said dielectric film at a region in which direct tunnel conduction is dominant.

2. A semiconductor device as defined in claim 1, wherein the intermediate insulating film is a silicon dioxide film having a film thickness equal to or less than 4 nm.

3. A semiconductor device as defined in claim 1 wherein said region has a film thickness defined by a relationship wherein a film thickness of the dielectric film is less than a specific permitivity of the dielectric film divided by a specific permitivity of the intermediate insulating film multiplied by a film thickness of the intermediate insulating film.

4. A semiconductor device as defined in claim 2, wherein said dielectric film is tantalum oxide.

5. A semiconductor device as defined in claim 2, wherein said first metal wiring is selected from a group consisting of Ti, Ta, Nb, Zr, Hf, Co, Y, W and Mo silicides and silicon.

6. A semiconductor device as claimed in claim 2, wherein the intermediate insulating film comprises silicon dioxide, has a film thickness equal to or less than 4 nm, and is formed by forming a dielectric film comprising a tantalum oxide formed on the first conductive metal wiring before the dielectric film is treated and grown within an oxidizing atmosphere.

7. A semiconductor device having a plurality of antifuse elements each comprising a first metal wiring, a second metal wiring, an interlayer insulating layer formed between the first and second metal wirings, a connection hole formed in said interlayer insulating layer therethrough and a dielectric film formed in the connection hole for insulating between the first and second metal wirings, wherein said dielectric film comprises a silicon film formed on said first metal wiring, an insulative silicon oxide layer formed over said silicon film, and a lamination film formed over said silicon oxide film, wherein said lamination film is selected from a group consisting of Ti, Ta, Nb, Zr, Y, Hf and Al oxides.

8. A semiconductor device as defined in claim 7, wherein said first metal wiring is coated with a coating selected from a group consisting of Ti, Ta, Nb, Zr, Y and Hf nitrides, and TiB and TiC films.

9. A semiconductor device as defined in claim 7 wherein a plurality of said dielectric films are laminated.

10. A semiconductor device as defined in claim 7, wherein said dielectric film comprises silicon oxide formed by high-frequency decomposing monosilane gas under a reduced pressure to deposit amorphous silicon, and thermally decomposing a vapor of metal alcoholate under a reduced pressure within an oxidizing atmosphere to grow at an interface between the amorphous silicon film and the metal oxide when depositing said metal oxide.

11. A semiconductor device as defined in claim 7 wherein a plurality of said dielectric films are laminated.

12. A semiconductor device having a plurality of antifuse elements each comprising an interlayer insulating layer formed between first and second metal wirings, a connection hole formed through said interlayer insulating layer, a conductive plug substantially filling said connection hole, and a substantially planar dielectric film covering said interlayer insulating layer and said conductive plug for insulating between said conductive plug and said second metal wiring, wherein said interlayer insulating layer and said connection hole in which said conductive plug is embedded are smoothed and wherein said dielectric film is selected from a group consisting of Ti, Ta, Nb, Zr, Y and Hf oxides and wherein said conductive plug is selected from a group consisting of W, Al, Cu, Ti nitride, Ta nitride, Nb nitride, Zr nitride, Hf nitride and Ti, Ta, Nb, Zr, Y and Hf silicides.

13. A semiconductor device as defined in claim 12, wherein said dielectric film is formed through the reactive sputter process.

14. A semiconductor device as defined in claim 13, wherein said dielectric film is tantalum oxide.

15. A semiconductor device as defined in claim 7, wherein the silicon film is subjected to vapor growth.

* * * * *